(12) United States Patent
Ikarashi

(10) Patent No.: US 6,590,465 B2
(45) Date of Patent: Jul. 8, 2003

(54) DUAL-BAND OSCILLATOR FOR PREVENTING REDUCTION IN OSCILLATION POWER CAUSED BY BIAS RESISTOR

(75) Inventor: Yasuhiro Ikarashi, Niigata-ken (JP)

(73) Assignee: Alps Electric Co., Ltd., Tokyo (JP)

(*) Notice: Subject to any disclaimer, the term of this patent is extended or adjusted under 35 U.S.C. 154(b) by 0 days.

(21) Appl. No.: 10/087,313

(22) Filed: Mar. 1, 2002

(65) Prior Publication Data

US 2002/0125958 A1 Sep. 12, 2002

(30) Foreign Application Priority Data

Mar. 6, 2001 (JP) .......................... 2001-061470

(51) Int. Cl.[7] .............................................. H03B 1/00
(52) U.S. Cl. ...................................................... 331/179
(58) Field of Search ............................... 331/46, 117 R, 331/167, 179, 181

(56) References Cited

U.S. PATENT DOCUMENTS 5,852,384 A    12/1998   Sakakura et al. ............. 331/48
5,999,061 A  * 12/1999   Pope et al. .................... 331/49
6,008,702 A  * 12/1999   Yamamoto .................... 331/179
6,188,295 B1 *  2/2001   Tsai ............................. 331/108 D
6,411,168 B2 *  6/2002   Yoshida ........................ 331/49

FOREIGN PATENT DOCUMENTS

JP    2001-111342    4/2001
JP    2001-127544    5/2001

* cited by examiner

Primary Examiner—My-Trang Nuton
(74) Attorney, Agent, or Firm—Brinks Hofer Gilson & Lione

(57) ABSTRACT

A dual-band oscillator includes a first oscillation circuit and a second oscillation circuit. A first emitter bias resistor for setting the emitter current of a first oscillation transistor in the first oscillation circuit is provided between the emitter of the first oscillation transistor and a second inductance element in the second oscillation circuit. A second emitter bias resistor for setting the emitter current of a second oscillation circuit in the second oscillation circuit is provided between the emitter of the second oscillation transistor and a first inductance element in the first oscillation circuit.

6 Claims, 2 Drawing Sheets

DUAL-BAND OSCILLATOR FOR PREVENTING REDUCTION IN OSCILLATION POWER CAUSED BY BIAS RESISTOR

BACKGROUND OF THE INVENTION

1. Field of the Invention

The present invention relates to dual-band oscillators which contain two oscillation circuits and which oscillate in different frequency bands.

2. Description of the Related Art

FIG. 3 is a circuit diagram of a known dual-band oscillator which oscillates in two frequency bands. A first oscillation circuit 41 contains a first common-collector oscillation transistor 42. The emitter is grounded through a bias resistor 43. A bias voltage is applied to the base by a first switching transistor 44. A parallel resonance circuit formed by a first inductor 45 and a first varactor diode 46 for resonance is connected between the base and the ground. A feedback capacitor 47 is connected between the base and the emitter, and a feedback capacitor 48 is connected between the emitter and the ground. The emitter outputs an oscillation signal.

A second oscillation circuit 51 contains a second common-collector oscillation transistor 52. The emitter is grounded through a bias resistor 53. A bias voltage is applied to the base by a second switching transistor 54. A parallel resonance circuit formed by a second inductor 55 and a second varactor diode 56 for resonance is connected between the base and the ground. A feedback capacitor 57 is connected between the base and the emitter, and a feedback capacitor 58 is connected between the emitter and the ground. The emitter outputs an oscillation signal.

A switching voltage for turning ON one of the first switching transistor 44 and the second switching transistor 55 and turning OFF the other is applied to the base of each of the first switching transistor 44 and the second switching transistor 54. Thus, one of the first oscillation circuit 41 and the second oscillation circuit 51 oscillates. The oscillation frequency can be changed by changing a control voltage applied to the cathode of each of the first and second varactor diodes 46 and 56.

In the known oscillator, the bias resistors 43 and 53 w connected to the emitters are connected in parallel to the feedback capacitors 48 and 58, respectively. An oscillation signal current is directed to flow through the bias resistors 43 and 53. As a result, the oscillation power is reduced, and the phase noise increases.

SUMMARY OF THE INVENTION

Accordingly, it is an object of the present invention to easily prevent a reduction in oscillation power, which is caused by an emitter bias resistor in an oscillation transistor, without adding a special circuit or component.

In order to achieve the foregoing objects, a dual-band oscillator according to the present invention is provided including a first oscillation circuit; a second oscillation circuit; and a switching device for alternatively operating the first oscillation circuit and the second oscillation circuit. The first oscillation circuit includes a first oscillation transistor; a first inductance element having one end grounded and the other end coupled to the base of the first oscillation transistor; and a first emitter bias resistor for setting the emitter current of the first oscillation transistor. The second oscillation circuit includes a second oscillation transistor; a second inductance element having one end grounded and the other end coupled to the base of the second oscillation transistor; and a second emitter bias resistor for setting the emitter current of the second oscillation transistor. The first emitter bias resistor is provided between the emitter of the first oscillation transistor and the second inductance element. The second emitter bias resistor is provided between the emitter of the second oscillation transistor and the first inductance element. Accordingly, a loss of oscillation signal of the operative oscillation circuit can be reduced by utilizing the inductance element in the inoperative oscillation circuit.

The switching device may include a first switching transistor and a second switching transistor. The first switching transistor and the second switching transistor may be turned ON/OFF in such a manner that one is ON while the other is OFF. A bias voltage may be applied to the base of the first oscillation transistor by the first switching transistor. A bias voltage may applied to the base of the second oscillation transistor by the second switching transistor. Accordingly, the two oscillation circuits can be switched between operative and inoperative states.

The switching device may include a first switching transistor and a second switching transistor. The first switching transistor and the second switching transistor may be turned ON/OFF in such a manner that that one is ON while the other is OFF. The first switching transistor may be provided in series to the first emitter bias resistor. The second switching transistor may be provided in series to the second emitter bias resistor. Accordingly, the emitter current of each oscillation transistor flowing into each inductance element can be interrupted by each switching transistor.

The first switching transistor may be turned ON/OFF by the second switching transistor. Accordingly, it is only necessary to apply the switching voltage for switching between ON and OFF states to the second switching transistor.

The first inductance element may be provided with a first center tap for dividing the first inductance element into two. The second inductance element may be provided with a second center tap for dividing the second inductance element into two. The first center tap may be grounded through a first capacitor. The second center tap may be grounded through a second capacitor. Accordingly, the high frequency current flowing from the emitter of each oscillation transistor to the ground can be reduced.

A parallel resonance circuit formed by one portion of the divided first inductance element and the first capacitor may be caused to resonate with the oscillation frequency of the second oscillation circuit. A parallel resonance circuit formed by one portion of the divided second inductance element and the second capacitor may be caused to resonate with the oscillation frequency of the first oscillation circuit. Accordingly, the high frequency current flowing from the emitter of each oscillation circuit to the ground can be reduced furthermore.

DESCRIPTION OF THE PREFERRED EMBODIMENTS

Figure 1:
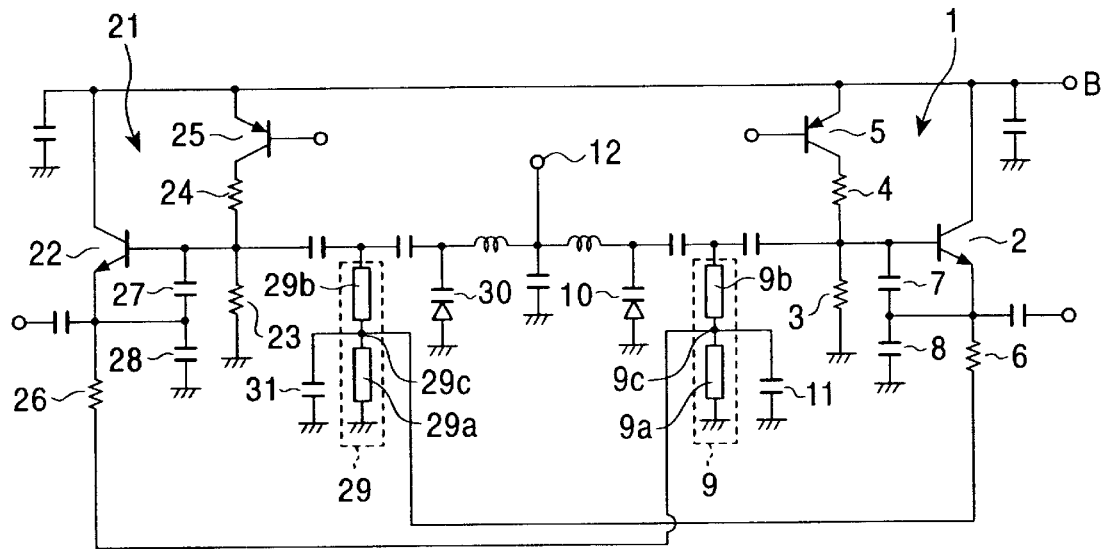
FIG. 1 is a circuit diagram showing the configuration of a dual-band oscillator according to a first embodiment of the present invention.

FIG. 1 shows a dual-band oscillator according to a first embodiment of the present invention. A first oscillation circuit 1 contains a first common-collector oscillation transistor 2 whose collector is connected to a power supply B. The base is grounded through a base bias resistor 3. A bias voltage is applied to the base by a series circuit formed by a base bias resistor 4 and a first switching transistor 5. The first switching transistor 5 switches the first oscillation transistor 2 between operative and inoperative states. The first switching transistor 5 is turned ON/OFF by a switching voltage applied to the base thereof. When the first switching transistor 5 is turned OFF, the first oscillation transistor 2 becomes inoperative. A first emitter bias resistor 6 for setting the emitter current of the first oscillation transistor 2 is connected to the-emitter.

A feedback capacitor 7 is connected between the base and the emitter, and a feedback capacitor 8 is connected between the emitter and the ground. A parallel resonance circuit formed by a first inductance element 9 and a first varactor diode 10 is connected between the base and the ground. One end of the first inductance element 9 and the anode of the first varactor diode 10 are grounded, whereas the other end of the first inductance element 9 and the cathode of the first varactor diode 10 are coupled to the base. The first inductance element 9 may be formed by a strip conductor.

The first inductance element 9 is provided with a center tap 9c which divides the first inductance element 9 into two portions 9a and 9b. The first center tap 9c is grounded through a first capacitor 11. A control terminal 12 applies a control voltage to the cathode of the first varactor diode 10. The oscillation frequency can be changed by changing the control voltage. The emitter outputs an oscillation signal.

A second oscillation circuit 21 contains a second common-collector oscillation transistor 22 whose collector is connected to the power supply B. The base is grounded through a base bias resistor 23. A bias voltage is applied to the base by a series circuit formed by a base bias resistor 24 and a second switching transistor 25. The second switching transistor 25 switches the second oscillation transistor 22 between operative and inoperative states. The second switching transistor 25 is turned ON/OFF by a switching voltage applied to the base thereof. When the second switching transistor 25 is turned OFF, the second oscillation transistor 22 becomes inoperative. A second emitter bias resistor 26 for setting the emitter current of the second oscillation transistor 22 is connected to the emitter.

A feedback capacitor 27 is connected between the base and the emitter, and a feedback capacitor 28 is connected between the emitter and the ground. A parallel resonance circuit formed by a second inductance element 29 and a second varactor diode 30 is connected between the base and the ground. One end of the second inductance element 29 and the anode of the second varactor diode 30 are grounded, whereas the other end of the second inductance element 29 and the cathode of the second varactor diode 30 are coupled to the base. The second inductance element 29 may be formed by a strip conductor.

The second inductance element 29 is provided with a center tap 29c which divides the second inductance element 29 into two portions 29a and 29b. The second center tap 29c is grounded through a second capacitor 31. The control terminal 12 applies a control voltage to the cathode of the second varactor diode 30. The oscillation frequency can be changed by changing the control voltage. The emitter outputs an oscillation signal.

The first switching transistor 5 and the second switching transistor 25 are switched so that one is ON while the other is OFF. The first emitter bias resistor 6 in the first oscillation circuit 1 is connected to the center tap 29c of the second inductance element 29 in the second oscillation circuit 21. The second emitter bias resistor 26 in the second oscillation circuit 21 is connected to the center tap 9c of the first inductance element 9 in the first oscillation circuit 1.

The parallel resonance circuit formed by the portion 9a of the divided first inductance element 9 and the first capacitor 11 in the first oscillation circuit 1 is caused to resonate with the oscillation frequency of the second oscillation circuit 21. The parallel resonance circuit formed by the portion 29a of the divided second inductance element 29 and the second capacitor 31 in the second oscillation circuit 21 is caused to resonate with the oscillation frequency of the first oscillation circuit 1. The first and second capacitors 11 and 31 may be formed by discrete capacitor components. Alternatively, the first and second capacitors 11 and 31 may be formed by a conductive foil of a printed circuit board (not shown) forming the first and second oscillation circuits 1 and 21.

Arranged as described above, when the first switching transistor 5 is turned ON, an electric current flows from the emitter of the first oscillation transistor 2 to the ground through the first emitter bias resistor 6 and the portion 29a of the second inductance element 29. In contrast, since the portion 29a of the second inductance element 29 blocks a high-frequency current, no high-frequency current flows through the first emitter bias resistor 6. As a result, a loss of oscillation signal of the first oscillation circuit 1, which is caused by the first emitter bias resistor 6, is reduced, and the phase noise is also reduced. By causing the parallel resonance circuit formed by the portion 29a of the second inductance element 29 and the second capacitor 31 in the second oscillation circuit 21 to resonate with the oscillation frequency of the first oscillation circuit 1, these advantages become more apparent.

For similar reasons, a loss of oscillation signal of the second oscillation circuit 21, which is caused by the second emitter bias resistor 26, is reduced, and the phase noise is also reduced. By causing the parallel resonance circuit formed by the portion 9a of the first inductance element 9 and the first capacitor 11 in the first oscillation circuit 1 to resonate with the oscillation frequency of the second oscillation circuit 21, these advantages become more apparent. As described above, a loss of oscillation signal of the operative oscillation circuit can be reduced by utilizing the inductance element of the inoperative oscillation circuit.

Figure 2:
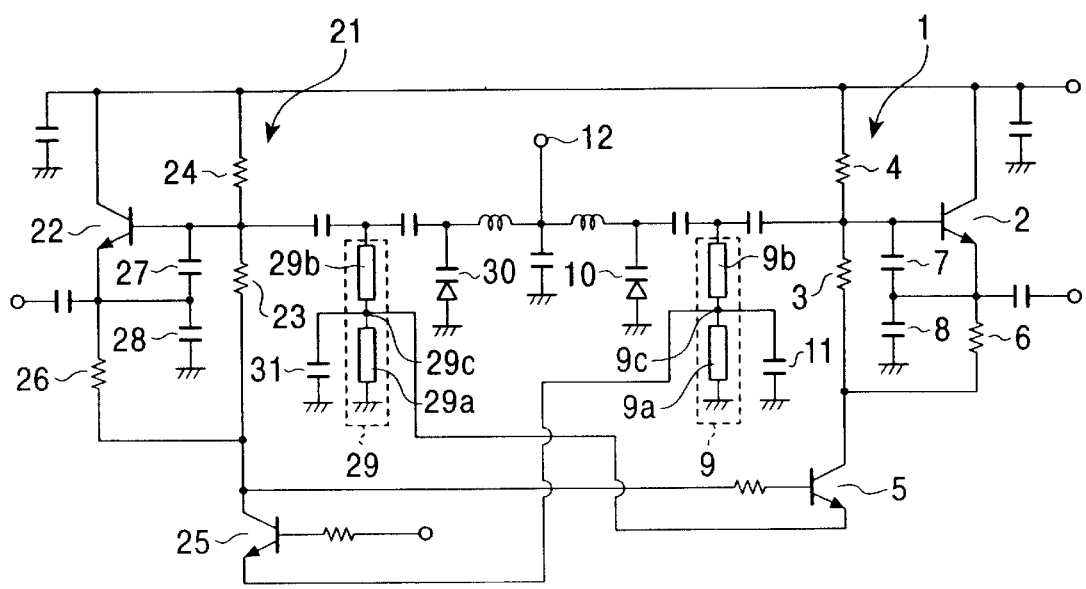
FIG. 2 is a circuit diagram showing the configuration of a dual-band oscillator according to a second embodiment of the present invention.
Figure 3:
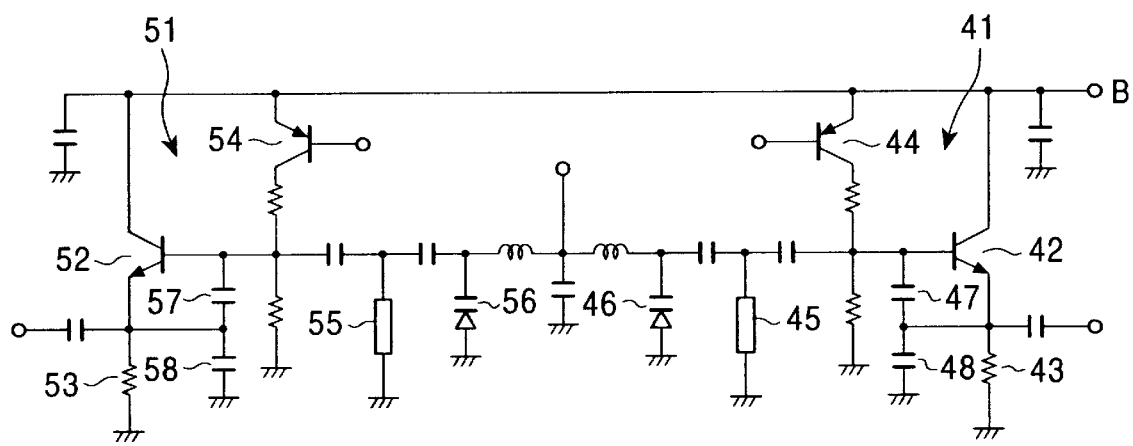
FIG. 3 is a circuit diagram showing the configuration of a known dual-band oscillator.

FIG. 2 shows the configuration of a second embodiment. In the first oscillation circuit 1, the base bias resistor 3 connected to the base of the first oscillation transistor 2 and the first emitter bias resistor 6 connected to the emitter are connected to the collector of the first switching transistor 5. The emitter of the first switching transistor 5 is connected to the center tap 29c of the second inductance element 29 in the second oscillation circuit 21. The other base bias resistor 4 is connected to the power supply.

In the second oscillation circuit 21, the base bias resistor 23 connected to the base of the second oscillation transistor 22 and the second emitter bias resistor 26 connected to the emitter are connected to the collector of the second switching transistor 25. The emitter of the second switching transistor 25 is connected to the center tap 9c of the first inductance element 9 in the first oscillation circuit 1. The other base bias resistor 24 is connected to the power supply.

The base of the first switching transistor 5 is connected to the collector of the second switching transistor 25. A switching voltage for turning ON/OFF the second switching transistor 25 is applied to the base of the second switching transistor 25.

Arranged as shown in FIG. 2, when the second switching transistor 25 is turned OFF, the first switching transistor 5 is turned ON, and hence the first oscillation circuit 1 enters an oscillation state. The emitter current of the first oscillation transistor 2 flows into the ground through the series circuit formed by the first emitter bias resistor 6, the first switching transistor 5, and the portion 29a of the second inductance element 29. In this case, as described in the first embodiment, a loss of oscillation signal is reduced. Since the second switching transistor 25 is OFF, the second oscillation circuit 21 does not oscillate.

In contrast, when the second switching transistor 25 is turned ON, the first oscillation circuit 1 stops oscillating, and the second oscillation circuit 21 starts oscillating. The emitter current of the second oscillation transistor 22 flows into the ground through the series circuit formed by the second emitter bias resistor 26, the second switching transistor 25, and the portion 9a of the first inductance element 9. In this case, as described in the first embodiment, a loss of oscillation signal is reduced.

What is claimed is:

1. A dual-band oscillator comprising:
    a first oscillation circuit;
    a second oscillation circuit; and
    a switch to alternatively operate the first oscillation circuit and the second oscillation circuit;
    the first oscillation circuit comprising:
        a first oscillation transistor;
        a first inductance element having a first end grounded and a second end coupled to a base of the first oscillation transistor; and
        a first emitter bias resistor to set an emitter current of the first oscillation transistor;
    the second oscillation circuit comprising:
        a second oscillation transistor;
        a second inductance element having a first end grounded and a second end coupled to a base of the second oscillation transistor; and
        a second emitter bias resistor to set an emitter current of the second oscillation transistor;
    wherein the first emitter bias resistor is provided between an emitter of the first oscillation transistor and the second inductance element, and
    the second emitter bias resistor is provided between an emitter of the second oscillation transistor and the first inductance element.

2. A dual-band oscillator according to claim 1, wherein the switch comprises a first switching transistor and a second switching transistor, the first switching transistor and the second switching transistor being turned ON/OFF such that one of the first switching transistor and second switching transistor is ON while the other of the first switching transistor and second switching transistor is OFF,
    a bias voltage is applied to the base of the first oscillation transistor by the first switching transistor, and
    a bias voltage is applied to the base of the second oscillation transistor by the second switching transistor.

3. A dual-band oscillator according to claim 1, wherein the switch comprises a first switching transistor and a second switching transistor, the first switching transistor and the second switching transistor being turned ON/OFF such that one of the first switching transistor and second switching transistor is ON while the other of the first switching transistor and second switching transistor is OFF,
    the first switching transistor is provided in series with the first emitter bias resistor, and
    the second switching transistor is provided in series with the second emitter bias resistor.

4. A dual-band oscillator according to claim 3, wherein the first switching transistor is turned ON/OFF by the second switching transistor.

5. A dual-band oscillator according to claim 1, wherein the first inductance element is provided with a first center tap that divides the first inductance element into a first two portions,
    the second inductance element is provided with a second center tap that divides the second inductance element into a second two portions,
    the first center tap is grounded through a first capacitance, and
    the second center tap is grounded through a second capacitance.

6. A dual-band oscillator according to claim 5, wherein a parallel resonance circuit formed by one portion of the divided first inductance element and the first capacitance resonates with an oscillation frequency of the second oscillation circuit, and
    a parallel resonance circuit formed by one portion of the divided second inductance element and the second capacitance resonates with an oscillation frequency of the first oscillation circuit.

* * * * *